United States Patent
Weeman et al.

(10) Patent No.: US 10,484,002 B1
(45) Date of Patent: Nov. 19, 2019

(54) HIGH-SPEED HIGH-RESOLUTION DIGITAL-TO-ANALOG CONVERTER

(71) Applicant: Keithley Instruments, LLC, Solon, OH (US)

(72) Inventors: William C. Weeman, Aurora, OH (US); Gregory Roberts, II, Cleveland, OH (US)

(73) Assignee: Keithley Instruments, LLC, Solon, OH (US)

( * ) Notice: Subject to any disclaimer, the term of this patent is extended or adjusted under 35 U.S.C. 154(b) by 0 days.

(21) Appl. No.: 16/234,445

(22) Filed: Dec. 27, 2018

(51) Int. Cl.
*H03M 1/66* (2006.01)
*G01R 1/067* (2006.01)

(52) U.S. Cl.
CPC .......... *H03M 1/66* (2013.01); *G01R 1/06766* (2013.01)

(58) Field of Classification Search
CPC ........................................ H03M 1/66
USPC .................................................. 341/144, 154
See application file for complete search history.

(56) References Cited

U.S. PATENT DOCUMENTS

| | | | | |
|---|---|---|---|---|
| 7,433,397 B2 * | 10/2008 | Garlepp | ............... | H04L 25/063 375/229 |
| 7,679,435 B2 * | 3/2010 | Tsuji | .................... | H03F 3/2175 330/10 |
| 9,325,337 B1 * | 4/2016 | Dempsey | .............. | H03M 1/109 |

* cited by examiner

*Primary Examiner* — Peguy Jean Pierre
(74) *Attorney, Agent, or Firm* — Miller Nash Graham & Dunn; Andrew J. Harrington

(57) ABSTRACT

A digital-to-analog converter, including an input to receive a digital signal; a first comparator configured to receive the digital signal and output a first signal based on the digital signal and a first threshold; a second comparator configured to receive the digital signal and output a second signal based on the digital signal and a second threshold, the second threshold different from the first threshold; and an integrator configured to receive the first signal and the second signal and integrate the first signal and the second signal into an analog signal that represents the digital signal.

20 Claims, 4 Drawing Sheets

HIGH-SPEED HIGH-RESOLUTION DIGITAL-TO-ANALOG CONVERTER

TECHNICAL FIELD

This disclosure is directed to systems and methods related to a digital-to-analog converter (DAC), and in particular, to a DAC that operates at a high-speed with high-resolution, which may be used in a source measure unit (SMU).

BACKGROUND

Conventional DACs generally offer a trade-off of either high-resolution with a slower speed and/or latency, or a lower resolution that requires impractical data rates or generates too much wideband noise to be of use in creating, for example, a source measure unit output signal. Further, each of these two types of conventional DACs are relatively expensive, resulting in higher manufacturing costs when these conventional DACs are used in an SMU.

Embodiments of the disclosure address these and other deficiencies of the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

Disclosed herein is a high-resolution, high-speed DAC, including a number of parallel gain stages, the outputs of which are combined into an analog signal through an integrator stage. In some embodiments, only a single integrator stage is used to combine the outputs into an analog signal. Embodiments of the disclosure allow for higher update rates, such as equal to or greater than 150 megasamples per second (Msps) for digital-to-analog conversion. Embodiments of the DAC of the disclosure also allow for better performance in some test and measurement devices, such as source measure units, in areas such as pulsing, controlled slew-rates, and more flexible behaviors that vary by specific application areas.

Figure 1:
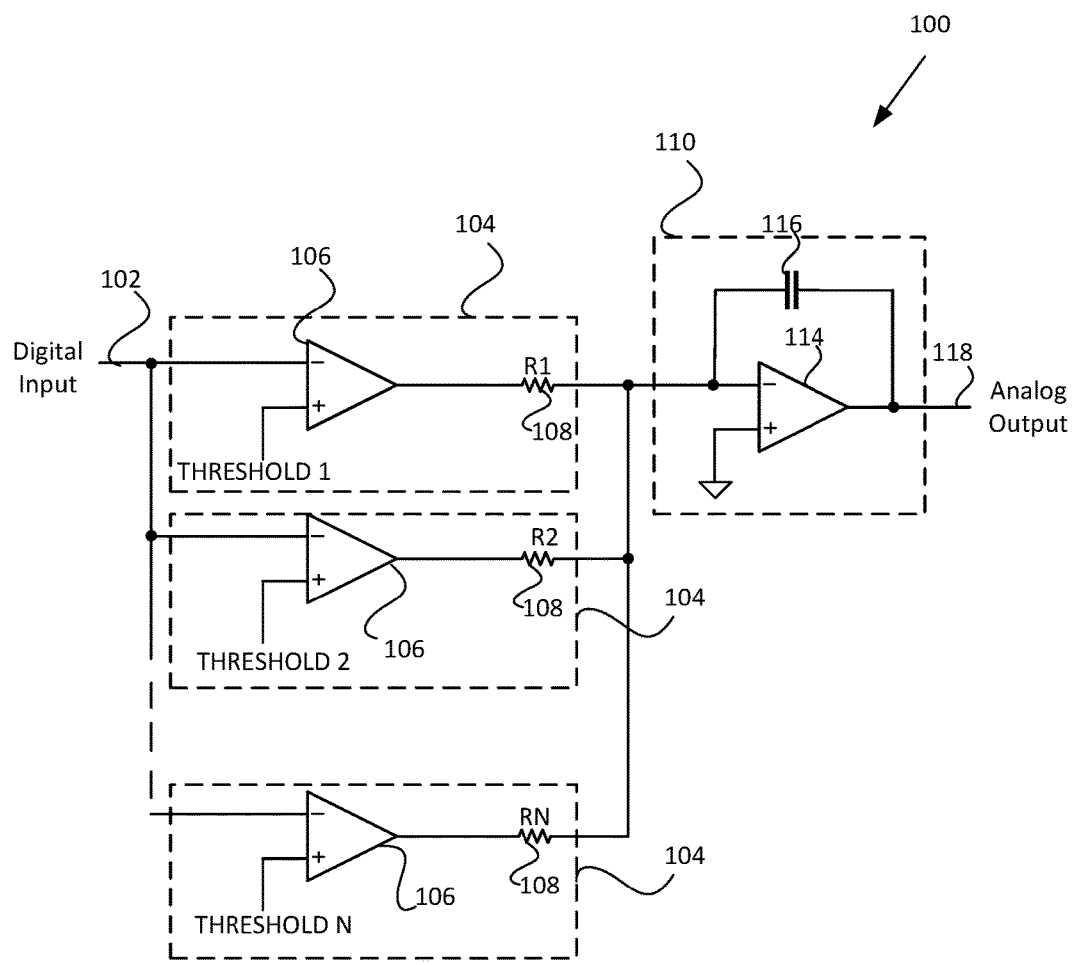
FIG. 1 is an example diagram of a DAC according to some embodiments of the disclosure.

FIG. 1 illustrates an example embodiment of a DAC 100 according to some embodiments of the disclosure. DAC 100 includes an input to receive a digital signal 102 at first through Nth gain stages 104, where N is a value greater than 1. Each gain stage 104 includes a comparator 106 and a resistor 108. Each comparator 106 compares the digital value to a unique threshold. That is, the threshold received at each comparator 106 is different. Further, the resistance of each resistor 108 is different.

An integrator stage 110 receives an output from each of the gain stages 104. The integrator stage sums and filters the multiple outputs of the gain stages 104 into a single analog output signal 118. The integrator stage 110 may include an integrator, such as an operational amplifier integrator, which includes an operational amplifier 114 and a feedback loop having a capacitor 116. The analog output 118 of the DAC 100 responds to changes in the input voltage of the integrator stage 110 from each of the gain stages 104 over time, such that the analog output 118 of the integrator stage 110 is proportional to the integral of the input voltage. That is, the magnitude of the output signal is determined by the length of time a voltage is present at the input of the integrator stage 110, as the current through the capacitor 116 in the feedback loop charges or discharges the capacitor 116 as the negative feedback occurs.

The comparators 106, as mentioned above, each have a different threshold input. The comparators 106 receive the entire digital signal 102 and when the digital signal 102 is greater than a respective threshold, the respective comparator 106 outputs a positive value. When the digital signal is less than a second threshold, which may be a negative of the first threshold (i.e., equal magnitude but opposite sign of the first threshold), the comparator 106 outputs a negative value. When the digital signal is between the threshold and the second threshold, the comparators 106 output a zero value. Each of the outputs of the various gain stages are then summed together in the integrator stage 110 and output as an analog output 118, as described above. The thresholds for each gain stage 104 may be different.

In some embodiments, the comparators 106 may output a positive value when compared to a first threshold value and a negative value when compared to a second threshold value. In this embodiment, the second threshold value is less than the first threshold value. However, unlike above, the first threshold value and the second threshold value may not be symmetrical. When the digital value is between the first threshold and the second threshold, then the comparator 106 outputs a zero value, similar to above. And, as also similar to above, the first and second thresholds for each gain stage 104 may be different.

Figure 2:
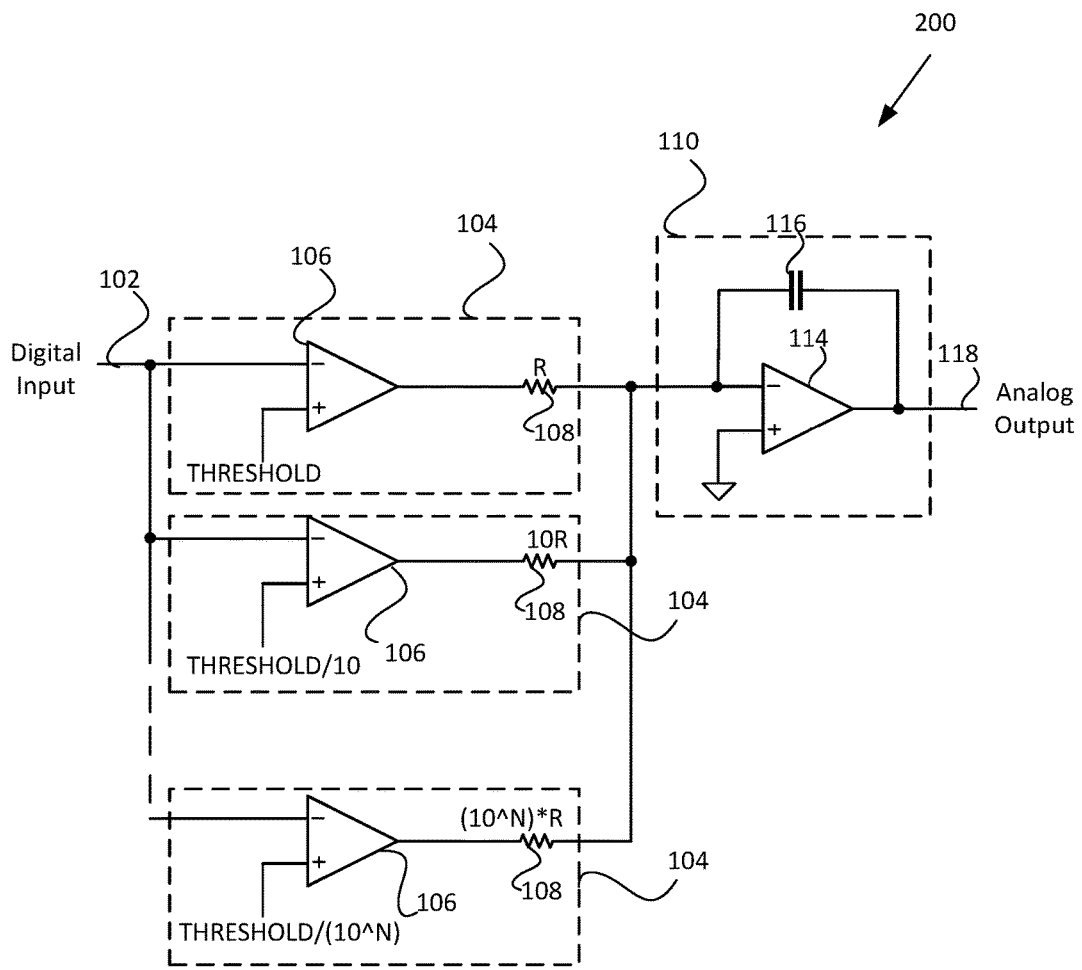
FIG. 2 is an example diagram of a DAC according to other embodiments of the disclosure.

FIG. 2 illustrates another example of embodiment of a DAC 200. In this example, the structure of the DAC 200 is similar to that of DAC 100, and as such, like components are given the same reference numbers, and will not be discussed in additional detail with respect to this embodiment.

In the embodiment of FIG. 2, the gain stages 104 are decade-weighted, which can provide a balance between the number of comparators 106 versus signal latency and signal level. For example, in the decade-weighted gain stages 104 each threshold is one-tenth of the previous gain stage threshold. So, the threshold for the second comparator 106 in the second gain stage 104 is one-tenth of the first comparator, and the threshold for the Nth comparator 106 in the Nth gain stage 104 is $10^{(-N)}$ times the first threshold.

The respective resistors 108 in each gain stage are also decade weighted. The second resistor 108 in the second gain stage 108 has a resistance that is ten times higher than the resistor 108 in the first gain stage 108. The Nth resistor 108 in the Nth gain stage 108 has a resistance that is $10^N$ times greater than the resistance of the first resistor 108.

The DAC 200 can provide high-resolution. For example, for a DAC 200 having five bi-polar gain stages 104, the native sample rate resolution is only ($2*2^5=64$) possible states. However, each clock cycle of the DAC 200 can reach 64 more states from the previously reached states, meaning that after 3 cycles there are $64*64*64=2^{18}$ possible states (equivalent to an 18-bit DAC). The span of the DAC 200 after 3 cycles is only +/−33333 (slightly better than a 16-bit DAC); but it is possible to reach a span nearly equivalent to an 18-bit DAC after 9 cycles (span of $2*10^5-2=199998$ vs $2^{18}=262144$). Operating the DAC 200 at a high sample rate, such as 150 MHz or greater, allows for performance equivalent to a nearly 18-bit, 15 Msps DAC. Averaging of the analog output 118 to less than the native sample rate may lead to further increases in possible resolution due to the dithering effects of noise already present in the system at these levels. This allows the DAC 200 to operate at a high sample rate, such as 150 MHz or greater, while generating a signal which has a higher level of resolution when averaged over longer periods of time.

Figure 3:
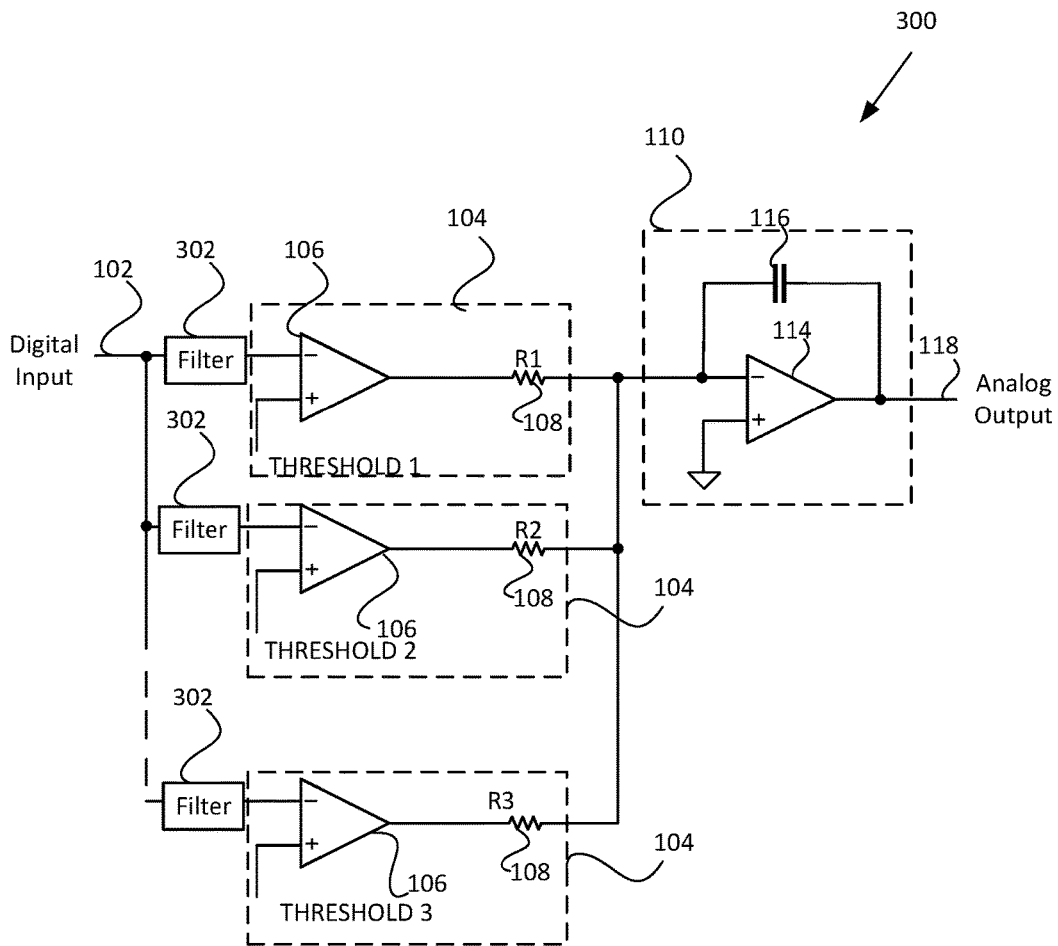
FIG. 3 is an example diagram of a DAC according to other embodiments of the disclosure.

FIG. 3 illustrates another example embodiment of a DAC 300. In this example, the structure of the DAC 300 is similar to that of DAC 100, and as such, like components are given the same reference numbers, and will not be discussed in additional detail with respect to this embodiment.

In the embodiment illustrated in FIG. 3, some comparators 106 may be driven with different digital signals. That is, one or more filters 302 may be provided prior to the comparators 106. The one or more filters 302 may include, for example, a moving average filter to reduce noise, a low pass filter to reduce bandwidth, a down-sampling filter to reduce switch transitions, or a combination of any of the above. Although FIG. 3 illustrates a filter 302 prior to each comparator 106, one of ordinary skill in the art will recognize that only some of the inputs to the comparators 106 may be filtered. For example, in some embodiments, filters 302 may only be provided in front of gain stages 104 for the slower and/or least significant bits to increase precision and reduce output noise.

Further, the gain stages 104 of FIG. 3 can include the decade-weighted gain stages 104 described with respect to FIG. 2. That is, the filters 302 of FIG. 3 can be combined with the embodiment shown in FIG. 2.

Depending on a signal slew, the DACs 100, 200, and 300 each provide low output noise. Conventional DACs with a high oversampling ratio achieve low noise by using high-order filtering to remove the ripple due to input quantization noise. However, for small signals generated by the embodiments of the disclosure, only the least-significant bit gain stage 104, the Nth gain stage, will be active, which means that the filter 302 on the Nth gain stage can ensure that noise is small compared to the expected signal deviation. Using the embodiment of FIG. 3, as an example, with five decade-weighted gain stages 104, after 10 cycles of the input codes the reachable output signal span is 222220 and the minimum quantization level is +/−1, resulting in a signal-to-quantization-noise ratio of 106.94 db (20*log(222220)), which is only slightly less than that expected for an 18-bit DAC (108.37 db). Here again, operating the DACs 100, 200, and 300 at a high-sample rate, such as 150 MHz or greater, allows for performance equivalent to a nearly 18-bit, 15 Msps DAC.

Each of the embodiments of the disclosure, as shown in FIGS. 1-3, for example, have gain stages 104 provided in a parallel structure, which feed into a single integrator stage 110. Having a single integrator stage 110 provides stability for the DACs 100, 200, and 300. The parallel structure of the gain stages 104 also provides low-latency. Typical high-order modulators require a resulting DAC to contain multiple integration stages, which can add latency and phase, which may be detrimental to the goals of achieving a fast and accurate DAC. As such, embodiments of the disclosure have the parallel structure of the gain stages 104 leading to a single integrator stage 110 to reduce the latency and phase.

In some embodiments, the comparators 106 of any of FIG. 1, 2, or 3, may be implemented in a field-programmable gate array (FPGA) or Application Specific Integrated Circuit (ASIC). The output of the comparators 106 are used to drive high-speed analog switches, and the analog integrator 110 then creates the final analog output signal 118 through the integrator stage 110. The signals through the analog switches are structured to mitigate any switching noise from reaching the output of the DAC 100, 200, or 300.

Although not shown, an external feedback loop may be provided to correct for any non-idealities in the DAC circuit that are present in the analog output. This may be determined, for example, by providing an analog-to-digital converter which can convert the analog output 118 to a digital signal, which can be compared to the original input digital signal. Any non-idealities, such as bias currents, leakage currents, comparator jitter, resistor mis-match, long-term drift, etc., can then be corrected through this feedback loop.

Figure 4:
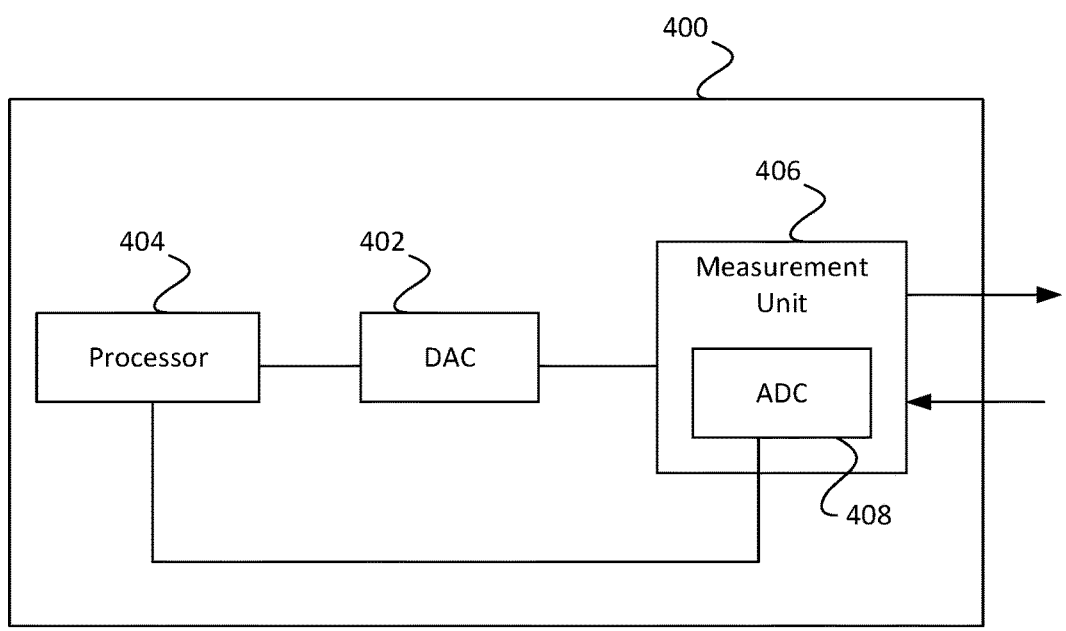
FIG. 4 is an example block diagram of a source measure unit include one of the DACs of FIGS. 1-3.

FIG. 4 illustrates an example of a source measure unit 400 with a DAC 402 according to embodiments of the disclosure. The DAC 402 may be any one of DACs 100, 200, or 300, discussed above. The source measure unit includes a processor 404 which sends a digital signal to the DAC 402. The DAC 402 converts the digital signal to the analog signal, as discussed above, to be used as a source signal to a device under test. The output of the DAC 402 is sent to a measurement unit 406, which outputs the analog signal to the device under test, but which also receives an input signal from the device under test and measures a response of the device under test based on the source signal.

The measurement unit 404 may include an analog-to-digital converter 408 which receives the response from the device under test. The ADC 408 may digitize the response of the device under test and send the digitized response to the processor 402 for output to a user or for further processing.

Aspects of the disclosure may operate on particularly created hardware, firmware, digital signal processors, or on a specially programmed computer including a processor operating according to programmed instructions. The terms controller or processor as used herein are intended to include microprocessors, microcomputers, ASICs, FPGAs, and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 a digital-to-analog converter, including an input to receive a digital signal; a first comparator configured to receive the digital signal and output a first signal based on the digital signal and a first threshold; a second comparator configured to receive the digital signal and output a second signal based on the digital signal and a second threshold, the second threshold different from the first threshold; and an integrator configured to receive the first signal and the second signal and integrate the first signal and the second signal into an analog signal that represents the digital signal.

Example 2 is the digital-to-analog converter of example 1, wherein the second threshold is one-tenth of the first threshold.

Example 3 is the digital-to-analog converter of either one of examples 1 and 2, wherein the first comparator is further configured to output the first signal based on a third threshold, wherein the first signal is a positive signal when the digital signal is greater than the first threshold, a negative signal when the digital signal is less than the third threshold, and a zero value when the digital signal is between the first threshold and the third threshold.

Example 4 is the digital-to-analog converter of example 3, wherein the second comparator is further configured to output the second signal based on a fourth threshold, wherein the second signal is a positive signal when the digital signal is greater than the second threshold, a negative signal when the digital signal is less than the fourth threshold, and a zero value when the digital signal is between the second threshold and the fourth threshold.

Example 5 is the digital-to-analog converter of any one of examples 1-4, further comprising a filter configured to receive the digital signal and output a filtered digital signal, wherein the second comparator is configured to receive the filtered digital signal.

Example 6 is the digital-to-analog converter of any one of examples 1-5, further comprising a single integrator.

Example 7 is the digital-to-analog converter of claim 1, further comprising a first resistor electrically coupled between the first comparator and an input of the integrator; and a second resistor electrically coupled between the second comparator and the input of the integrator, wherein a resistance of the second resistor is ten times greater than a resistance of the first resistor.

Example 8 is a source measure unit including a processor to generate a digital signal; a digital-to-analog converter configured to receive the digital signal and output an analog signal. The digital-to-analog converter includes a first comparator configured to receive the digital signal and output a first signal based on the digital signal and a first threshold, a second comparator configured to receive the digital signal and output a second signal based on the digital signal and a second threshold, the second threshold different from the first threshold, and an integrator configured to receive the first signal and the second signal and integrate the first signal and the second signal into an analog signal that represents the digital signal. An output outputs the analog signal to a device under test and a measurement unit receives a signal from the device under test based on the analog signal.

Example 9 is the source measure unit of example 8, wherein the second threshold is one-tenth of the first threshold.

Example 10 is the source measure unit of either one of examples 8 and 9, wherein the first comparator is further configured to output the first signal based on a third threshold, wherein the first signal is a positive signal when the digital signal is greater than the first threshold, a negative signal when the digital signal is less than the third threshold, and a zero value when the digital signal is between the first threshold and the third threshold.

Example 11 is the source measure unit of example 10, wherein the second comparator is further configured to output the second signal based on a fourth threshold, wherein the second signal is a positive signal when the digital signal is greater than the second threshold, a negative signal when the digital signal is less than the fourth threshold, and a zero value when the digital signal is between the second threshold and the fourth threshold.

Example 12 is the source measure unit of any one of examples 8-11, wherein the digital-to-analog converter further includes a filter configured to receive the digital signal and output a filtered digital signal, wherein the second comparator is configured to receive the filtered digital signal.

Example 13 is the source measure unit of any one of examples 8-12, wherein the digital-to-analog converter further includes a single integrator.

Example 14 is the source measure unit of any one of examples 8-13, further comprising a first resistor electrically coupled between the first comparator and an input of the integrator; and a second resistor electrically coupled between the second comparator and the input of the integrator, wherein a resistance of the second resistor is ten times greater than a resistance of the first resistor.

Example 15 is a method for converting a digital signal to an analog signal, comprising receiving the digital signal at an input; comparing the digital signal to a first threshold; based on the comparison to the first threshold, generating a first signal; comparing the digital signal to a second threshold, different from the first threshold; based on the comparison to the second threshold, generating a second signal;

integrating the first signal and the second signal to generate an analog signal representing the digital signal.

Example 16 is the method of example 15, wherein the second threshold is one-tenth of the first threshold.

Example 17 is the method of either example 15 or 16, wherein comparing the digital signal to the first threshold further includes comparing the digital signal to a third threshold, different from the first threshold, and wherein generating the first signal includes generating the first signal as a positive signal when the digital signal is greater than the first threshold, generating the first signal as a negative signal when the digital signal is less than the third threshold, and generating the first signal as a zero value when the digital signal is between the first threshold and the third threshold.

Example 18 is the method of example 17, wherein comparing the digital signal to the second threshold further includes comparing the digital signal to a fourth threshold, different from the second threshold, and wherein generating the second signal includes generating the second signal as a positive signal when the digital signal is greater than the second threshold, generating the first signal as a negative signal when the digital signal is less than the fourth threshold, and generating the first signal as a zero value when the digital signal is between the second threshold and the fourth threshold.

Example 19 is the method of any one of examples 15-18, further comprising filtering the digital signal to generate a filtered digital signal, and wherein comparing the digital signal to the first threshold includes comparing the filtered digital signal to the first threshold.

Example 20 is the method of any one of examples 15-19, wherein comparing the digital signal to the first threshold is performed in parallel with comparing the digital signal to the second threshold.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

We claim:

1. A digital-to-analog converter, comprising:
    an input to receive a digital signal;
    a first comparator configured to receive the digital signal and output a first signal based on the digital signal and a first threshold;
    a second comparator configured to receive the digital signal and output a second signal based on the digital signal and a second threshold, the second threshold different from the first threshold;
    an integrator configured to receive the first signal and the second signal and integrate the first signal and the second signal into an analog signal that represents the digital signal;
    a first resistor coupled between the first comparator and an input of the integrator; and
    a second resistor coupled between the second comparator and the input of the integrator.

2. The digital-to-analog converter of claim 1, wherein the second threshold is one-tenth of the first threshold.

3. The digital-to-analog converter of claim 1, wherein a resistance of the second resistor is ten times greater than a resistance of the first resistor.

4. The digital-to-analog converter of claim 1, wherein the first comparator is further configured to output the first signal based on a third threshold, wherein the first signal is a positive signal when the digital signal is greater than the first threshold, a negative signal when the digital signal is less than the third threshold, and a zero value when the digital signal is between the first threshold and the third threshold.

5. The digital-to-analog converter of claim 4, wherein the second comparator is further configured to output the second signal based on a fourth threshold, wherein the second signal is a positive signal when the digital signal is greater than the second threshold, a negative signal when the digital signal is less than the fourth threshold, and a zero value when the digital signal is between the second threshold and the fourth threshold.

6. The digital-to-analog converter of claim 1, further comprising a filter configured to receive the digital signal and output a filtered digital signal, wherein the second comparator is configured to receive the filtered digital signal.

7. The digital-to-analog converter of claim 1, wherein the integrator is a single integrator.

8. A source measure unit including:
    a processor to generate a digital signal;
    a digital-to-analog converter configured to receive the digital signal and output an analog signal, the digital-to-analog converter including:
        a first comparator configured to receive the digital signal and output a first signal based on the digital signal and a first threshold,
        a second comparator configured to receive the digital signal and output a second signal based on the digital signal and a second threshold, the second threshold different from the first threshold,
        an integrator configured to receive the first signal and the second signal and integrate the first signal and the second signal into an analog signal that represents the digital signal,
        a first resistor coupled between the first comparator and an input of the integrator, and
        a second resistor coupled between the second comparator and the input of the integrator;
    an output to output the analog signal to a device under test; and
    a measurement unit configured to receive a signal from the device under test based on the analog signal.

9. The source measure unit of claim 8, wherein the second threshold is one-tenth of the first threshold.

10. The source measure unit of claim 8, wherein a resistance of the second resistor is ten times greater than a resistance of the first resistor.

11. The source measure unit of claim 8, wherein the first comparator is further configured to output the first signal based on a third threshold, wherein the first signal is a positive signal when the digital signal is greater than the first threshold, a negative signal when the digital signal is less than the third threshold, and a zero value when the digital signal is between the first threshold and the third threshold.

12. The source measure unit of claim 11, wherein the second comparator is further configured to output the second signal based on a fourth threshold, wherein the second signal is a positive signal when the digital signal is greater than the second threshold, a negative signal when the digital signal is less than the fourth threshold, and a zero value when the digital signal is between the second threshold and the fourth threshold.

13. The source measure unit of claim 8, wherein the digital-to-analog converter further includes a filter configured to receive the digital signal and output a filtered digital signal, wherein the second comparator is configured to receive the filtered digital signal.

14. The source measure unit of claim 8, wherein the integrator is a single integrator.

15. A method for converting a digital signal to an analog signal, comprising:
receiving the digital signal at an input;
comparing the digital signal to a first threshold;
based on the comparison to the first threshold, generating a first signal;
comparing the digital signal to a second threshold, different from the first threshold;
based on the comparison to the second threshold, generating a second signal;
integrating the first signal and the second signal to generate an analog signal representing the digital signal.

16. The method of claim 15, wherein the second threshold is one-tenth of the first threshold.

17. The method of claim 15, wherein comparing the digital signal to the first threshold further includes comparing the digital signal to a third threshold, different from the first threshold, and
wherein generating the first signal includes generating the first signal as a positive signal when the digital signal is greater than the first threshold, generating the first signal as a negative signal when the digital signal is less than the third threshold, and generating the first signal as a zero value when the digital signal is between the first threshold and the third threshold.

18. The method of claim 17, wherein comparing the digital signal to the second threshold further includes comparing the digital signal to a fourth threshold, different from the second threshold, and
wherein generating the second signal includes generating the second signal as a positive signal when the digital signal is greater than the second threshold, generating the first signal as a negative signal when the digital signal is less than the fourth threshold, and generating the first signal as a zero value when the digital signal is between the second threshold and the fourth threshold.

19. The method of claim 15, further comprising filtering the digital signal to generate a filtered digital signal, and wherein comparing the digital signal to the first threshold includes comparing the filtered digital signal to the first threshold.

20. The method of claim 15, wherein comparing the digital signal to the first threshold is performed in parallel with comparing the digital signal to the second threshold.

* * * * *